(12) United States Patent
Watanabe

(10) Patent No.: US 6,900,141 B2
(45) Date of Patent: May 31, 2005

(54) METHOD OF FORMING A RESIST PATTERN AND FABRICATING TAPERED FEATURES

(75) Inventor: Minoru Watanabe, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/829,450

(22) Filed: Apr. 22, 2004

(65) Prior Publication Data

US 2005/0059256 A1 Mar. 17, 2005

(30) Foreign Application Priority Data

Sep. 12, 2003 (JP) ......................................... 2003-320779

(51) Int. Cl.[7] .................. H01L 21/302; H01L 21/461
(52) U.S. Cl. .................. 438/725; 438/798; 438/715; 438/949; 430/296; 430/311
(58) Field of Search .................. 438/725, 715, 438/798, 949; 430/296, 311

(56) References Cited

U.S. PATENT DOCUMENTS

| | | | |
|---|---|---|---|
| 5,096,802 A | 3/1992 | Hu | |
| 6,057,081 A | * 5/2000 | Yunogami et al. | 430/313 |
| 6,358,670 B1 | * 3/2002 | Wong et al. | 430/296 |
| 6,627,384 B1 | 9/2003 | Kim et al. | |

FOREIGN PATENT DOCUMENTS

| | | |
|---|---|---|
| JP | 2000-182940 | 6/2000 |
| JP | 2001-307993 | 11/2001 |
| JP | 2001-326153 | 11/2001 |
| JP | 2001-332484 | 11/2001 |

* cited by examiner

Primary Examiner—Caridad Everhart
(74) Attorney, Agent, or Firm—Rabin & Berdo P.C.

(57) ABSTRACT

A resist pattern for fabricating a microelectronic device is irradiated with an energy beam, raising the glass transition temperature of the upper parts of the resist pattern, then baked, causing a transition to a glassy state in lower parts of the resist pattern, which flow viscously so that the resist pattern assumes a tapered cross sectional shape. When this tapered resist pattern is used as an etching mask, tapered features can be formed in the device. In particular, tapered contact holes can be formed, providing an increased alignment tolerance and enabling the size of the device to be reduced.

18 Claims, 2 Drawing Sheets

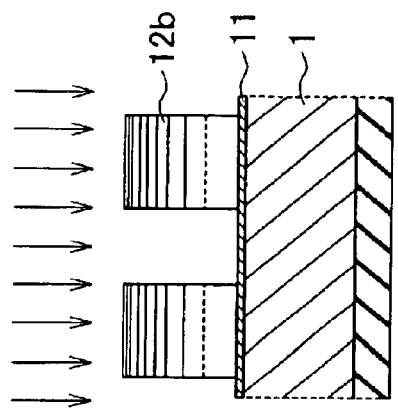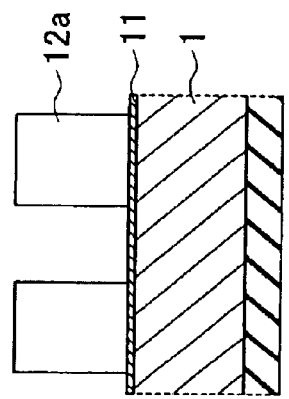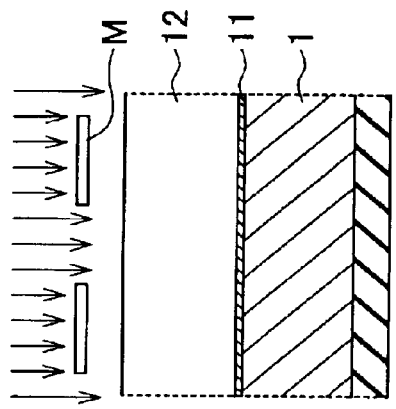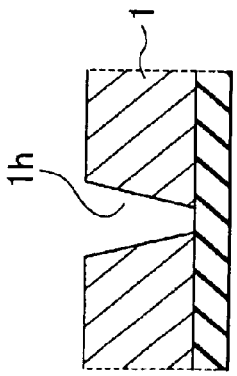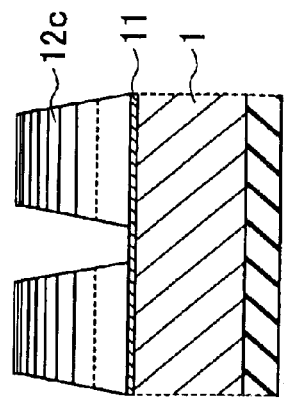

METHOD OF FORMING A RESIST PATTERN AND FABRICATING TAPERED FEATURES

BACKGROUND OF THE INVENTION

1. Field of the Invention

The present invention relates to the fabrication of a microelectronic device such as a semiconductor integrated circuit, more particularly to the formation of tapered holes and other tapered features.

2. Description of the Related Art

The trend of semiconductor devices toward higher performance and smaller geometries creates a growing need to shrink the dimensions of their circuit patterns, including the diameters of contact holes and via holes. Reducing the diameters of these holes provides an increased mask alignment margin during the fabrication process, leading to increased fabrication yields, and contributes to the reduction of semiconductor chip size so that more chips can be fabricated on a single wafer, leading to reduced fabrication costs.

Tapered etching of contact and via holes is one known method of obtaining these benefits. Conventional tapered etching uses a resist pattern with vertical walls as an etching mask, but deposits material on the inner walls of the holes as they are etched, thereby gradually reducing the size of the holes. When applied to, for example, a wafer on which a hole resist pattern with vertical holes 0.26 micrometers (0.26 $\mu$m) in diameter has been formed by standard photolithography, this method can form holes that taper from a diameter of 0.26 $\mu$m at the top to 0.20 $\mu$m at the bottom. Descriptions of this method can be found in Japanese Unexamined Patent Application Publications No. 2000-182940, 2001-307993, 2001-326153, and 2001-332484.

In the tapered etching technology described above, however, it is difficult to control the taper angle, and etching may stop due to the deposition of material, leaving holes incompletely formed.

SUMMARY OF THE INVENTION

An object of the present invention is to form holes and other features with accurately controllable taper during the fabrication of a microelectronic device.

Another object of the invention is to form such tapered features reliably.

The invention provides a method of forming a resist pattern in which, after a substrate is coated with a resist material and the resist material is patterned by being exposed to light and developed, the surface of the resulting resist pattern is irradiated with an energy beam such as an electron beam. The irradiation increases the glass transition temperature of the upper part of the resist pattern. The resist pattern is then baked, causing lower parts of the resist pattern to flow viscously so that the resist pattern assumes a tapered cross section.

The invention also provides a device fabrication method in which, after a tapered resist pattern has been formed as described above, the substrate is etched by an etching process that simultaneously etches the tapered walls of the resist pattern. As a result, tapered features such as holes, grooves, or trenches are formed in the substrate. The substrate may be, for example, a semiconductor substrate such as a silicon substrate or a dielectric substrate such as an interlayer dielectric film.

The dimensions of the tapered features created in the substrate are accurately controllable by control of the energy beam dosage and other parameters in the formation of the tapered resist pattern. Tapered features can therefore be formed with high reliability.

BRIEF DESCRIPTION OF THE DRAWINGS

In the attached drawings:

FIGS. 1A, 1B, 1C, 1D, and 1E are sectional views illustrating the formation of a tapered resist pattern and feature in a first embodiment of the invention.

DETAILED DESCRIPTION OF THE INVENTION

Figure 2A:
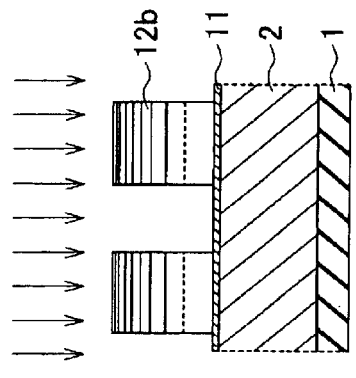
FIGS. 2A, 2B, 2C, 2D, and 2E are sectional views illustrating the formation of a tapered resist pattern and feature in a second embodiment of the invention.
Figure 2B:
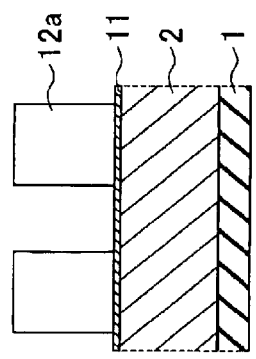
Figure 2C:
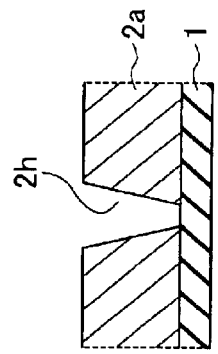
Figure 2D:
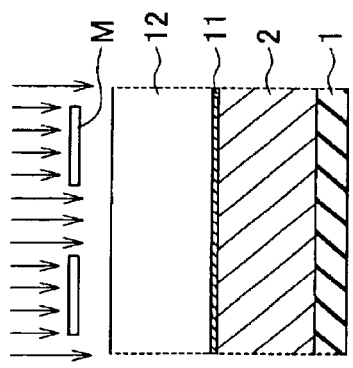

Embodiments of the invention will now be described with reference to the attached drawings, in which like elements are indicated by like reference characters.

First Embodiment (Step 1) As shown in FIG. 1A, the surface of a semiconductor substrate such as a silicon (Si) wafer substrate 1 is given an antireflection coating 11 approximately 110 nm thick, then coated with a photoresist 12 having a glass transition temperature that increases under irradiation by an electron beam. An example of a suitable photoresist is the SEPR411 chemically amplified positive photoresist made by Shin-Etsu Chemical Co., Ltd. The photoresist coating is approximately 1000 nm thick. The substrate and its coatings are baked at a temperature of about 100 degrees Celsius; then a krypton fluoride (KrF) excimer laser exposure system (numerical aperture=0.60, σ=0.75) is used to expose the photoresist 12 to approximately 95 mJ/cm$^2$ of ultraviolet light through a mask M having a desired circuit design pattern, including hole patterns 0.28 $\mu$m in diameter.

(Step 2) After the exposure, the photoresist 12 is developed in a 2.38 percent (%) tetramethyl ammonium hydroxide (TMAH) developer solution. This process vertically removes the exposed parts of the photoresist 12 as shown in FIG. 1B, forming a resist pattern 12A having 280-nm holes.

(Step 3) As shown in FIG. 1C, the entire surface of the substrate, including the resist pattern 12A, is irradiated by an electron beam. In this embodiment, irradiation energy dosage parameters of one kilo-electron volt (1 keV) and five hundred microcoulombs per square centimeter (500 $\mu$C/cm$^2$) are used so as to selectively process the upper part of the resist pattern 12A. The glass transition temperature in the upper part of the irradiated resist pattern 12B is raised to about 150 degrees Celsius, increasing the heat resistance of the upper part.

(Step 4) A hot plate is used to bake the resist pattern 12B at 155 degrees Celsius for 90 seconds. This causes the lower part of the resist pattern 12B, which has not been processed by the electron beam and has a lower glass transition temperature, to assume a viscous state, forming a resist pattern 12C with a tapered sectional hole pattern as shown in FIG. 1D. While the hole diameter in the upper part of the resist pattern 12C remains 0.28 $\mu$m as first formed, the hole diameter in the lower part of the resist pattern 12C is reduced to, for example, 0.10 $\mu$m.

These steps form a tapered resist pattern 12C, which is used as an etching mask to etch the substrate 1 by conventional methods. In this process, the tapered walls of the resist pattern 12C are etched simultaneously, gradually enlarging the holes in the resist pattern so that the substrate 1 is etched in a tapered manner. The tapered holes 1h formed in the substrate 1 have a top diameter of 0.28 μm and a bottom diameter of 0.10 μm as shown in FIG. 1E.

By irradiating the surface of the resist pattern 12A with an electron beam to raise its glass transition temperature in the upper part, and then baking the irradiated resist pattern 12B so that the lower part flows viscously, the first embodiment enables the formation of a resist pattern 12C with accurately tapered holes. By using this resist pattern 12C as a mask in an etching process that etches both the substrate and the tapered walls of the resist pattern, the first embodiment forms holes in the substrate with a similarly tapered shape. The taper angle and hole diameter reduction rate can be controlled by selection of appropriate resist pattern formation parameters, including the type of photoresist 12, the film thicknesses, the electron beam dosage, and the baking conditions. Creation of a three-dimensional tapered shape in the photolithography process enables higher-precision dimensional control than the conventional method of forming a tapered shape in the etching process.

Second Embodiment (Step 1) A silicon substrate 1 is processed to form isolation regions and gate electrodes (not shown); then an interlayer dielectric film 2 such as a silicon oxide film (nondoped silicate glass, NSG) approximately 1000 nm thick is formed on the surface of the silicon substrate 1. The word 'substrate' will be used below to refer to both the silicon substrate 1 and the interlayer dielectric film 2. The substrate surface is coated with an antireflection coating 11 with a thickness of approximately 110 nm; then a photoresist 12 having a glass transition temperature that increases under irradiation by an electron beam is coated onto the antireflection coating 11 to a thickness of approximately 1000 nm, and baked at a temperature of about 100 degrees Celsius.

Next, as shown in FIG. 2A, the photoresist 12 is exposed to ultraviolet light at approximately 95 mJ/cm$^2$ by a KrF excimer laser exposure system (numerical aperture=0.60, σ=0.75), through a mask M having a desired circuit design pattern including contact hole patterns 0.28 μm in diameter.

(Step 2) After the exposure, the photoresist 12 is developed in a 2.38% tetra-methyl ammonium hydroxide developer solution, vertically removing the exposed areas of the photoresist 12 as shown in FIG. 1B to form a resist pattern 12A having 280-nm holes.

(Step 3) As shown in FIG. 1C, the entire surface of the substrate, including the resist pattern 12A, is irradiated by an electron beam with energy dosage parameters of 1 keV and 500° C./cm$^2$, selectively processing the upper part of the resist pattern 12A. The glass transition temperature of the part of the resist pattern 12B that is processed by the electron beam is raised to about 150 degrees Celsius, increasing its heat resistance.

(Step 4) A hot plate is used to bake the resist pattern 12B at 155 degrees Celsius for 90 seconds. This causes the lower part of the resist pattern 12B, which has not been processed by the electron beam, to flow viscously, forming a resist pattern 12C with a tapered hole as shown in FIG. 1D. While the hole diameter in the upper part of the resist pattern 12C remains 0.28 μm as first formed, the hole diameter in the lower part of the resist pattern 12C is reduced to, for example, 0.10 μm.

Figure 2E:
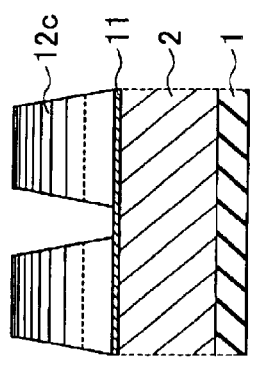

(Step 5) The tapered resist pattern 12C is used as an etching mask to etch the interlayer dielectric film 2. In this process, the tapered walls of the resist pattern 12C are etched simultaneously, causing the interlayer dielectric film 2 to be etched in a tapered manner, forming contact holes 2h with a tapered cross sectional shape having a top diameter of 0.28 μm and a bottom diameter of 0.1 μm as shown in FIG. 2E. Conventional metalization methods are then used to fill in the contact holes 2h and form interconnection wiring.

As described above, the resist pattern forming method in the second embodiment irradiates the resist pattern 12A with an electron beam to raise the glass transition temperature in the upper part of the resist, and then bakes the irradiated resist pattern 12B. This process forms a tapered resist pattern as in the first embodiment, enabling finely tapered contact holes to be formed, so that chip area can be reduced and adequate alignment margins can be obtained in the device fabrication process.

In a variation of the second embodiment, the same type of resist pattern is used to form tapered via holes for interconnecting two layers of metal wiring.

The present invention is not limited to the formation of holes. Resist patterns of the invented type can also be used to form grooves and trenches, including grooves and trenches for damascene wiring patterns, capacitors, etc.

The materials, dimensions, and processing conditions mentioned in the above embodiments are exemplary, and can be altered as the fabrication process requires. In particular, the invention can be practiced in processes using nanometer-level resist patterns.

The invention can be practiced not only in the fabrication of semiconductor integrated circuits, but also in the fabrication of masks, liquid crystal panels, thin-film magnetic heads, micro electromechanical systems (MEMS), and other devices.

Those skilled in the art will recognize that further variations are possible within the scope of the invention, which is defined in the appended claims.

What is claimed is:

1. A resist pattern formation method comprising:
coating a substrate with a resist material having a glass transition temperature that increases under irradiation by an energy beam;
forming a resist pattern by exposing and developing the resist material;
irradiating a surface of the resist pattern with the energy beam at a predetermined dosage to increase the glass transition temperature of upper parts of the resist pattern; and
baking the resist pattern at a temperature higher than the glass transition temperature of lower parts of the resist pattern but lower than the glass transition temperature of the upper parts of the resist pattern after irradiation by the energy beam, causing the lower parts of the resist pattern to flow viscously so that the resist pattern assumes a tapered cross section.

2. The resist pattern formation method of claim 1, wherein the substrate is a semiconductor substrate.

3. The resist pattern formation method of claim 1, wherein the substrate includes an interlayer dielectric film.

4. The resist pattern formation method of claim 1, wherein the resist pattern is a contact hole pattern.

5. The resist pattern formation method of claim 1, wherein the resist pattern is a via hole pattern.

6. The resist pattern formation method of claim 1, wherein the resist pattern is a trench pattern.

7. The resist pattern formation method of claim 1, wherein the resist pattern is a damascene groove pattern.

8. The resist pattern formation method of claim 1, wherein the resist pattern is a capacitor pattern.

9. The resist pattern formation method of claim 1, wherein the energy beam is an electron beam.

10. A device fabrication method comprising:
   coating a substrate with a resist material having a glass transition temperature that increases responsive to irradiation by an energy beam;
   forming a resist pattern by exposing and developing the resist material;
   irradiating a surface of the resist pattern with the energy bean at a predetermined dosage to increase the glass transition temperature of upper parts of the resist pattern;
   baking the resist pattern after irradiation by the energy beam, causing lower parts of the resist pattern to flow viscously so that the resist pattern assumes a tapered cross section; and
   forming a tapered feature in the substrate by etching the substrate by a process that simultaneously etches the tapered cross section of the resist pattern, the resist pattern functioning as an etching mask during the etching process.

11. The device fabrication method of claim 10, wherein the etched substrate is a semiconductor substrate.

12. The device fabrication method of claim 10, wherein the etched substrate is an interlayer dielectric film.

13. The device fabrication method of claim 10, wherein the tapered feature is a contact hole.

14. The device fabrication method of claim 10, wherein the tapered feature is a via hole.

15. The device fabrication method of claim 10, wherein the tapered feature is a trench.

16. The device fabrication method of claim 10, wherein the tapered feature is a damascene groove.

17. The device fabrication method of claim 10, wherein the tapered feature is a capacitor pattern.

18. The device fabrication method of claim 10, wherein the energy beam is an electron beam.

* * * * *